(12) United States Patent
Sumi et al.

(10) Patent No.: US 9,117,834 B2
(45) Date of Patent: Aug. 25, 2015

(54) ESD PROTECTION DEVICE AND METHOD FOR PRODUCING THE SAME

(71) Applicant: Murata Manufacturing Co., Ltd., Kyoto-fu (JP)

(72) Inventors: Takahiro Sumi, Kyoto-fu (JP); Jun Adachi, Kyoto-fu (JP); Takayuki Tsukizawa, Kyoto-fu (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/208,331

(22) Filed: Mar. 13, 2014

(65) Prior Publication Data

US 2014/0191360 A1 Jul. 10, 2014

Related U.S. Application Data

(63) Continuation of application No. PCT/JP2012/071518, filed on Aug. 26, 2012.

(30) Foreign Application Priority Data

Sep. 14, 2011 (JP) ................................. 2011-200089

(51) Int. Cl.
*H01L 29/66* (2006.01)
*H01L 23/60* (2006.01)
(Continued)

(52) U.S. Cl.
CPC .......... *H01L 23/60* (2013.01); *H01L 21/76886* (2013.01); *H01T 1/20* (2013.01);
(Continued)

(58) Field of Classification Search
CPC .............................. H01L 23/60; H01L 23/291
USPC ....................................... 257/173, 77; 438/758
See application file for complete search history.

(56) References Cited

U.S. PATENT DOCUMENTS

2010/0309595 A1 12/2010 Adachi

FOREIGN PATENT DOCUMENTS

CN   1805665 A   7/2006
CN   101183576 A   5/2008
(Continued)

OTHER PUBLICATIONS

International Search Report for Application No. PCT/JP2012/071518 dated Sep. 25, 2012.
(Continued)

*Primary Examiner* — Nicholas Tobergte
(74) *Attorney, Agent, or Firm* — Pearne & Gordon LLP

(57) ABSTRACT

An ESD protection device includes a first discharge electrode and a second discharge electrode arranged to oppose each other, a discharge supporting electrode formed so as to span between the first and second discharge electrodes, and an insulator substrate that retains the first and second discharge electrodes and the discharge supporting electrode. The discharge supporting electrode is constituted by a group of a plurality of metal particles each coated with a semiconductor film containing silicon carbide. This discharge supporting electrode is obtained by firing a semiconductor-metal complex powder in which a semiconductor powder composed of silicon carbide is fixed to surfaces of metal particles. Selection is made so that the relationship between a coating amount Q [wt %] of the semiconductor powder in the semiconductor-metal complex powder and a specific surface area S [m²/g] of the metal powder satisfies Q/S≥8.

6 Claims, 4 Drawing Sheets

(51) Int. Cl.
  *H01T 1/20* (2006.01)
  *H01T 4/10* (2006.01)
  *H01T 4/12* (2006.01)
  *H01T 21/00* (2006.01)
  *H01L 21/768* (2006.01)
  *H01L 23/29* (2006.01)

(52) U.S. Cl.
  CPC . *H01T 4/10* (2013.01); *H01T 4/12* (2013.01); *H01T 21/00* (2013.01); *H01L 23/291* (2013.01); *H01L 2924/0002* (2013.01)

(56) References Cited

FOREIGN PATENT DOCUMENTS

| | | |
|---|---|---|
| CN | 101933204 A | 12/2010 |
| EP | 2242154 A1 * | 10/2010 |
| JP | 2008-85284 A | 4/2007 |
| KR | 10-2010-0098722 A | 9/2010 |
| WO | 2009/098944 A1 | 8/2009 |
| WO | 2010/067503 A1 | 6/2010 |
| WO | 2011/040437 A1 | 4/2011 |

OTHER PUBLICATIONS

Written Opinion of the International Searching Authority for Application No. PCT/JP2012/071518 dated Sep. 25, 2012.

Office Action issued in corresponding Japanese Patent Application No. 2013-533593 dated Oct. 14, 2014.

Office Action issued in Chinese Patent Application No. 201280044289.6 dated Dec. 3, 2014.

* cited by examiner

ESD PROTECTION DEVICE AND METHOD FOR PRODUCING THE SAME

BACKGROUND OF THE INVENTION

1. Field of the Invention

The present invention relates to an electrostatic discharge (ESD) protection device and a method for producing the same. In particular, it relates to improvements of a discharge supporting electrode provided in an ESD protection device to promote electrostatic discharge.

2. Description of the Related Art

An overvoltage protection device which is of interest to the present invention is described in, for example, Japanese Unexamined Patent Application Publication No. 2008-85284 (Patent Document 1).

Patent Document 1 describes a material for an overvoltage protection device serving as a discharge supporting electrode for promoting discharge, the material containing a non-conductive powder (for example, silicon carbide with a particle diameter of 1 to 50 µm), a metal conductive powder (for example, copper with a particle diameter of 0.01 to 5 µm), and an adhesive (for example, a glass powder).

Patent Document 1 also describes a method for producing an overvoltage protection device, including a step of forming a material paste by evenly mixing a non-conductive powder, a metal conductive powder, and an adhesive at particular ratios, a step of applying the material paste onto a substrate by printing, and a step of subjecting the substrate to a firing treatment (temperature: 300° C. to 1200° C.).

However, according to the technology described in Patent Document 2 in which a glass powder is used as an adhesive, the glass component may become unevenly distributed depending on the dispersion state of the glass powder, possibly resulting in insufficient bonding between the metal conductive powder and the non-conductive powder. Accordingly, there is a problem in that shorting failure easily occurs especially in the event of high-voltage ESD.

An example of a technology that can address the aforementioned issue is one described in International Publication No. 2009/098944 pamphlet (Patent Document 2).

Patent Document 2 describes use of a discharge supporting electrode in which a conductive material (Cu powder or the like) coated with an inorganic material ($Al_2O_3$ or the like) is dispersed. According to the technology described in Patent Document 2, exposure of the conductive material is less compared to the technology described in Patent Document 1 and thus the insulation reliability can be enhanced. Moreover, since shorting between conductive materials rarely occurs even at an increased conductive material content, discharge can be promoted by increasing the amount of the conductive material and thus the peak voltage can be decreased.

However, the technology described in Patent Document 1 has the following challenges to be met.

The "conductive material coated with an inorganic material" according to the technology described in Patent Document 2 is merely a conductive material having surfaces coated with fine particles of an inorganic material, as described in paragraphs [0034] and [0094] and FIG. 4 of Patent Document 2. Accordingly, it is relatively difficult to completely cover the surfaces of the conductive material with an inorganic material and the conductive material may become exposed. Accordingly, further improvements have been desirable in relation with the insulation reliability.

Patent Document 1: Japanese Unexamined Patent Application Publication No. 2008-85284

Patent Document 2: International Publication No. 2009/098944 pamphlet

BRIEF SUMMARY OF THE INVENTION

An object of the present invention is to provide an ESD protection device that can address the challenge described above, in other words, an ESD protection device having high insulation reliability and good discharge properties, and a method for producing the ESD protection device.

The present invention is first directed to an ESD protection device that includes a first discharge electrode and a second discharge electrode arranged to oppose each other, a discharge supporting electrode formed so as to span between the first and second discharge electrodes, and an insulator substrate that retains the first and second discharge electrodes and the discharge supporting electrode and is characterized in that the discharge supporting electrode is constituted by a group of a plurality of metal particles each coated with a semiconductor film containing silicon carbide, thereby addressing the technical challenge described above.

When the metal particles constituting the discharge supporting electrode are coated with semiconductor films composed of silicon carbide, the insulation reliability at the time of discharge can be enhanced.

When $SiO_2$ derived from silicon carbide is present on a surface of the semiconductor film, this $SiO_2$ functions as a network-forming component of a glassy substance and strong bonds can be formed between the metal particles. Thus, the reliability of the ESD protection device can be enhanced.

The metal particles are preferably formed of copper or a copper alloy containing copper as a main component. In this manner, an ESD protection device can be offered at a relatively low cost. Moreover, since copper has a relatively high melting point, the insulation reliability at the time of discharge can be further improved. This is because if the melting point is low, the metal particles may melt and become sintered by the heat generated during discharge, possibly resulting in shorting.

In the ESD protection device of the present invention, the first and second discharge electrodes and the discharge supporting electrode are preferably positioned inside the insulator substrate, the insulator substrate preferably has a cavity where a gap between the first and second discharge electrodes lies, and the ESD protection device preferably further includes a first outer terminal electrode and a second outer terminal electrode which are formed on surfaces of the insulator substrate and respectively electrically connected to the first and second discharge electrodes. According to this structure, moisture resistance of the ESD protection device can be improved.

The present invention is also directed to a method for producing an ESD protection device.

A method for producing an ESD protection device according to the present invention includes a step of preparing a semiconductor-metal complex powder in which a semiconductor powder containing silicon carbide is fixed to surfaces of metal particles, a step of preparing an insulator substrate, a step of forming a green discharge supporting electrode on a surface of or inside the insulator substrate, the green discharge supporting electrode containing the semiconductor-metal complex powder, a step of forming a first discharge electrode and a second discharge electrode on a surface of or inside the insulator substrate so that the first and second discharge electrodes are opposed to each other on the discharge supporting electrode, and a step of firing the green discharge supporting electrode. The method is characterized in that the relationship between a coating amount Q [wt %] of the semiconductor powder in the semiconductor-metal complex powder and a specific surface area S [m$^2$/g] of the metal powder satisfies Q/S≥8.

The order in which the step of forming the discharge supporting electrode and the step of forming first and second discharge electrodes may be any.

In a preferred embodiment of the method for producing an ESD protection device according to the present invention, the step of preparing an insulator substrate includes a step of preparing a plurality of ceramic green sheets including a first ceramic green sheet and a second ceramic green sheet. In this case, the step of forming a green discharge supporting electrode and the step of forming a first discharge electrode and a second discharge electrode are performed on the first ceramic green sheet. In this preferred embodiment, the method further includes a step of forming a combustibly removable layer so as to cover a gap between the first and second discharge electrodes, a step of obtaining the insulator substrate in a green state by stacking the second ceramic green sheet on the first ceramic green sheet so as to cover the green discharge supporting electrode, the first and second discharge electrodes, and the combustibly removable layer, and a step of forming a first outer terminal electrode and a second outer terminal electrode, which are respectively electrically connected to the first and second discharge electrodes, on surfaces of the insulator substrate. In the firing step, the insulator substrate is obtained by sintering the ceramic green sheet and the combustibly removable layer is combustibly removed.

In the ESD protection device according to the present invention, because the discharge supporting electrode is constituted by a group of metal particles each covered with a semiconductor film composed of silicon carbide, deterioration of properties rarely occurs even when static electricity is repeatedly applied and the insulation reliability at the time of discharge can be enhanced. Since shorting between the metal particles does not easily occur even at a high metal particle content, the amount of the metal particles can be increased to promote discharge and decrease the peak voltage. Accordingly, the ESD protection device according to the present invention can be widely used to protect various devices and apparatuses such as semiconductor devices.

In the method for producing an ESD protection device according to the present invention, a semiconductor-metal complex powder in which a particular coating amount of a semiconductor powder composed of silicon carbide is fixed to surfaces of metal particles is used to form a discharge supporting electrode. Simply because of this, it becomes possible to obtain a discharge supporting electrode constituted by a group of metal particles covered with semiconductor films composed of silicon carbide after firing and achieve the advantage described above.

DETAILED DESCRIPTION OF THE INVENTION

Figure 1:
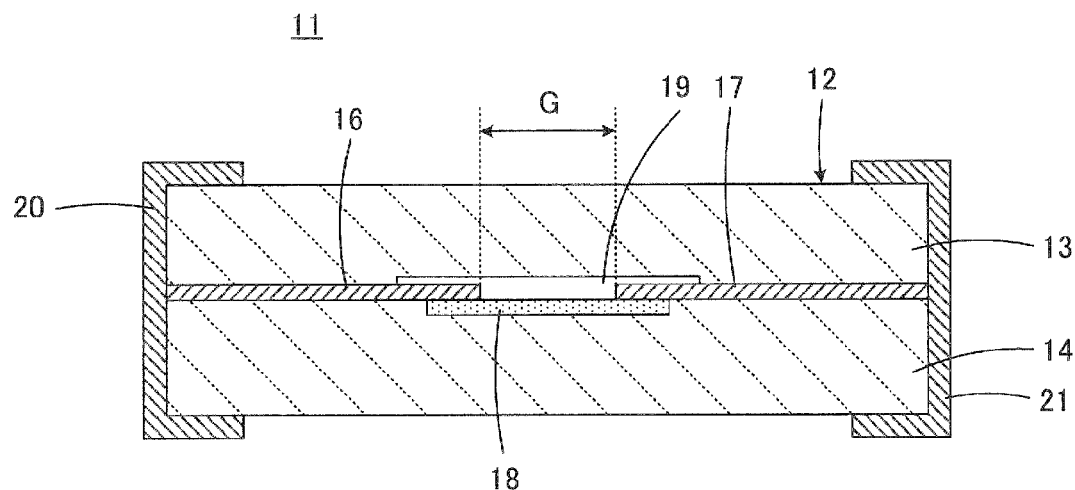
FIG. 1 is a cross-sectional view of an ESD protection device 11 according to a first embodiment of the present invention.

An ESD protection device 11 according to a first embodiment of the present invention will now be described with reference to FIG. 1.

The ESD protection device 11 includes an insulator substrate 12. The insulator substrate 12, for example, is composed of a low-temperature co-fired ceramic (LTCC) such as glass ceramic, high-temperature co-fired ceramic (HTCC) such as aluminum nitride or alumina, or a magnetic ceramic such as ferrite. The insulator substrate 12 has a layered structure that includes at least an upper layer portion 13 and a lower layer portion 14.

A first discharge electrode 16, a second discharge electrode 17, and a discharge supporting electrode 18 are disposed inside the insulator substrate 12 and between the upper layer portion 13 and the lower layer portion 14. The first discharge electrode 16 and the second discharge electrode 17 are opposed to each other with a particular gap G therebetween and the discharge supporting electrode 18 spans between the first discharge electrode 16 and the second discharge electrode 17. The portion where the gap G is located in the insulator substrate 12 is a cavity 19.

A first outer terminal electrode 20 and a second outer terminal electrode 21 are formed on outer surfaces of the insulator substrate 12. The first outer terminal electrode 20 and the second outer terminal electrode 21 are respectively electrically connected to the first discharge electrode 16 and the second discharge electrode 17.

Figure 2:
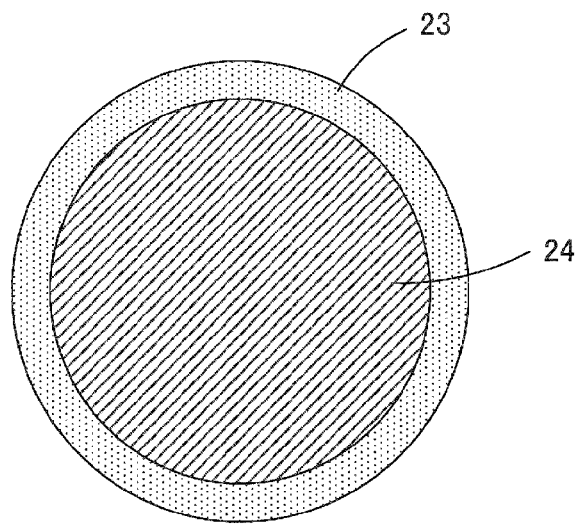
FIG. 2 is a schematic cross-sectional view of a metal particle 24 constituting a discharge supporting electrode 18 shown in FIG. 1.

In this ESD protection device 11, the discharge supporting electrode 18 is composed of a group of metal particles 24 each coated with a semiconductor film 23 composed of silicon carbide as shown in FIG. 2. When the metal particles 24 constituting the discharge supporting electrode 18 are coated with the semiconductor films 23 composed of silicon carbide, the insulation reliability at the time of discharge can be enhanced. Note that the metal particles 24 may have few portions not coated with the semiconductor films 23 as long as the insulation reliability is not substantially impaired.

Copper or a copper alloy containing copper as a main component is preferably used as the metal constituting the metal particles 24. Alternatively, silver, aluminum, molybdenum, tungsten, or the like may be used.

The ESD protection device 11 is produced as follows, for example.

First, ceramic green sheets that form an insulator substrate 12 are prepared. Of these ceramic green sheets, a first ceramic green sheet is used for forming, for example, a lower layer portion 14 of the insulator substrate 12, and a second ceramic green sheet is used for forming an upper layer portion 13.

A semiconductor-metal complex powder in which a semiconductor powder composed of silicon carbide is fixed to metal particle surfaces is prepared to form the discharge supporting electrode 18. The semiconductor-metal complex powder is produced by, for example, blending a semiconductor powder composed of silicon carbide and a metal powder at particular ratios and subjecting the resulting mixture to a mechanofusion process. The blend ratios of the semiconductor powder and the metal powder are selected so that the relationship between the coating amount Q [wt %] of the semiconductor powder in the semiconductor-metal complex powder obtained and the specific surface area S [m$^2$/g] of the metal powder satisfies Q/S≥8.

Next, a green paste film that has a particular pattern and that will form a discharge supporting electrode 18 is formed on the first ceramic green sheet by using a paste containing the semiconductor-metal complex powder.

Then a first discharge electrode 16 and a second discharge electrode 17 are formed on the first ceramic green sheet and on the green paste film, which is to be a discharge supporting electrode 18, so that the electrodes are opposed to each other with a particular gap G therebetween. The discharge electrodes 16 and 17 are formed by, for example, applying a conductive paste.

Next, a combustibly removable layer is formed so as to cover the gap G between the first discharge electrode 16 and the second discharge electrode 17. The combustibly removable layer is combusted and removed in the firing step described below so as to leave the cavity 19 inside the insulator substrate 12. The combustibly removable layer is formed by, for example, a paste containing resin beads.

The pastes respectively used for forming the discharge supporting electrode 18, the first discharge electrode 16, the second discharge electrode 17, and the combustibly removable layer may be directly applied onto a target object or by a transfer method or the like.

Next, the second ceramic green sheet is stacked on and press-bonded with the first ceramic green sheet so as to cover the green discharge supporting electrode 18, the first discharge electrode 16, the second discharge electrode 17, and the combustibly removable layer. As a result, a green insulator substrate 12 is obtained.

Then a first outer terminal electrode 20 and a second outer terminal electrode 21 are formed on surfaces of the green insulator substrates 12. The outer terminal electrodes 20 and 21 can be, for example, formed by applying a conductive paste.

Then a firing step is performed. In the firing step, the ceramic green sheets are sintered into an insulator substrate 12 and the discharge electrode 16, the discharge electrode 17, the discharge supporting electrode 18, the outer terminal electrodes 20 and 21 become sintered.

In the firing step described above, the semiconductor powder composed of silicon carbide melts at the metal particle surfaces of the semiconductor-metal complex metal powder contained in the green discharge supporting electrode 18, thereby forming a semiconductor film 23 composed of silicon carbide covering a surface of the metal particle 24, as shown in FIG. 2.

In this firing process, part of the silicon carbide on the surface of the metal particle 24 comes into contact with oxygen and may form $SiO_2$ which may function as a network-forming component of a glassy substance. $SiO_2$, however small in amount, strongly bonds the metal particles 24 to each other. Accordingly, the reliability of the ESD protection device 11 can be enhanced.

In the firing step, the combustibly removable layer vanishes as a result of combustion, and a cavity 19 is formed inside the insulator substrate 12.

Thus, an ESD protection device 11 is fabricated.

Note that in the case where copper or a copper alloy is used as the metal constituting the metal particles 24 and the discharge supporting electrode 18 is co-fired with the insulator substrate 12, the insulator substrate 12 is preferably composed of LTCC.

Figure 3:
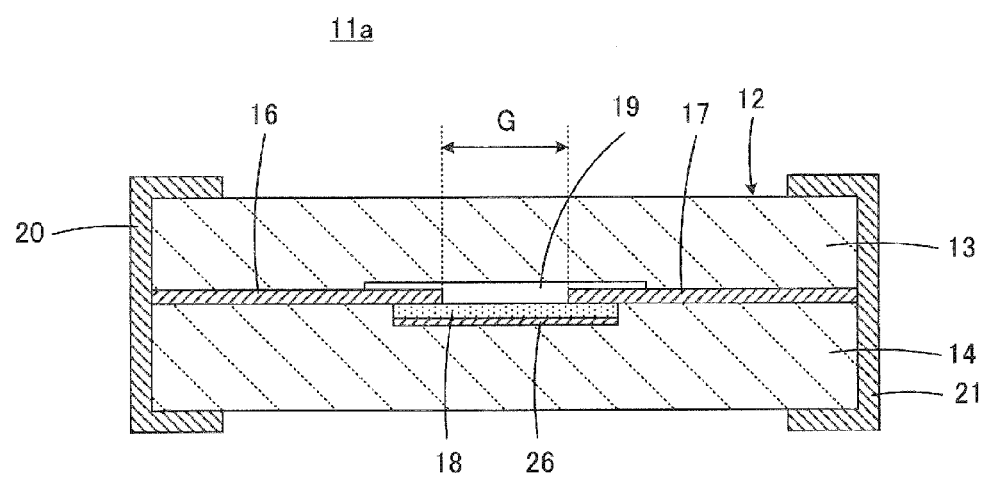
FIG. 3 is a cross-sectional view of an ESD protection device 11a according to a second embodiment of the present invention.

FIG. 3 shows an ESD protection device 11a according to a second embodiment of the present invention. In FIG. 3, the components equivalent to those shown in FIG. 1 are referred to by the same reference signs and description therefor is omitted to avoid redundancy.

The ESD protection device 11a shown in FIG. 3 is characterized in that a protection layer 26 composed of, for example, $Al_2O_3$ is formed along the interface between the discharge supporting electrode 18 and the insulator substrate 12. This structure is particularly effective when the insulator substrate 12 is composed of LTCC or a magnetic ceramic. In other words, in the case where the insulator substrate 12 is composed of LTCC, the protection layer 26 prevents diffusion and penetration of the glass component from the insulator substrate 12 into the discharge supporting electrode 18 in the firing step and prevents deterioration of the insulating properties of the discharge supporting electrode 18. In the case where the insulator substrate 12 is composed of a magnetic ceramic, the protection layer 26 prevents reduction of the magnetic ceramic material in the event of ESD and deterioration of the insulating properties of the insulator substrate 12.

The following modification examples are also within the scope of the present invention.

Although the discharge electrodes 16 and 17 and the discharge supporting electrode 18 are disposed inside the insulator substrate 12 in the illustrated embodiment, they may alternatively be disposed on outer surfaces of the insulator substrate.

Even in the case where the discharge electrodes 16 and 17 and the discharge supporting electrode 18 are disposed inside the insulator substrate 12, the cavity 19 need not always be formed.

The discharge supporting electrode 18 may contain a semiconductor powder such as silicon carbide and/or an insulator powder such as alumina in addition to the metal particles 24 coated with semiconductor films composed of silicon carbide.

The ESD protection device 11a may be built inside a board along with other functional devices.

Although firing for sintering the insulator substrate 12 is performed at the same time as firing for sintering the discharge electrodes 16 and 17 and the discharge supporting electrode 18 in the production method described above, an insulator substrate composed of a sintered ceramic may be preliminarily prepared and discharge electrodes and a discharge supporting electrode may be formed on this insulator substrate.

Next, Experimental Example performed to confirm the effects of the present invention is described.

EXPERIMENTAL EXAMPLE

<Preparation of Evaluation Samples>
(1) Preparation of Ceramic Green Sheets

Materials respectively containing Ba, Al, and Si as a main component were prepared as ceramic materials. The materials were blended to a particular composition and the resulting mixture was calcined at 800° C. to 1000° C. The calcined powder was pulverized for 12 hours in a zirconia ball mill to obtain a ceramic powder.

An organic solvent containing toluene and ekinen was added to the ceramic powder and the resulting mixture was mixed. A binder and a plasticizer were further added to the mixture and the resulting mixture was mixed again to obtain a slurry.

The slurry was formed into ceramic green sheets having a thickness of 50 μm by a doctor blade method. One of the ceramic green sheets prepared here is illustrated as a ceramic green sheet 31 in FIGS. 4 to 8. Another one of the ceramic green sheets is illustrated as a ceramic green sheet 36 in FIGS. 7 and 8.

(2) Preparation of Discharge Supporting Electrode Paste

Semiconductor powders shown in Table 1 and metal powders shown in Table 2 were prepared as raw materials.

TABLE 1

| Semiconductor powder No. | Semiconductor type | Average particle diameter (nm) | SSA ($m^2/g$) | Specific gravity |
|---|---|---|---|---|
| H-1 | SiC | 35 | 50 | 3.1 |
| H-2 | SiC | 500 | 15 | 3.2 |

TABLE 2

| Metal powder No. | Metal type | Average particle diameter (μm) | SSA ($m^2/g$) | Specific gravity |
|---|---|---|---|---|
| M-1 | Cu | 3.1 | 0.25 | 8.93 |
| M-2 | Cu | 1.9 | 0.45 | 8.93 |
| M-3 | Cu | 1.2 | 0.60 | 8.93 |

In Tables 1 and 2, the "Average particle diameter" was determined by a laser diffraction particle size distribution method, "SSA" (specific surface area) was determined by a BET method, and "Specific gravity" was determined by a gas phase substitution method.

Next, a semiconductor powder described in Table 1 and indicated by the reference number in the "Semiconductor powder type" column in Table 3, a metal powder described in Table 2 and indicated by the reference number in the "Metal powder type" column of Table 3 were blended at ratios described in the "Weight composition" and "Volume composition" columns in Table 3, and semiconductor-metal complex powders described in Table 3 were obtained by a mechanofusion method.

TABLE 3

| Semiconductor-metal complex powder No. | Metal powder type | Semiconductor powder type | Weight composition (wt %) | | Volume composition (vol %) | | Specific gravity | Semiconductor content (wt %)/SSA of metal powder ($m^2/g$) |
|---|---|---|---|---|---|---|---|---|
| | | | Metal content | Semiconductor content | Metal content | Semiconductor content | | |
| * MS-1 | M-1 | H-1 | 99.5 | 0.5 | 98.57 | 1.43 | 8.847 | 2.0 |
| * MS-2 | M-1 | H-1 | 99.0 | 1.0 | 97.17 | 2.83 | 8.765 | 4.0 |
| MS-3 | M-1 | H-1 | 98.0 | 2.0 | 94.45 | 5.55 | 8.606 | 8.0 |
| MS-4 | M-1 | H-1 | 97.0 | 3.0 | 91.82 | 8.18 | 8.453 | 12.0 |
| MS-5 | M-1 | H-1 | 95.0 | 5.0 | 86.83 | 13.17 | 8.162 | 20.0 |
| * MS-6 | M-2 | H-1 | 99.5 | 0.5 | 98.57 | 1.43 | 8.847 | 1.1 |
| * MS-7 | M-2 | H-1 | 99.0 | 1.0 | 97.17 | 2.83 | 8.765 | 2.2 |
| * MS-8 | M-2 | H-1 | 98.0 | 2.0 | 94.45 | 5.55 | 8.606 | 4.4 |
| * MS-9 | M-2 | H-1 | 97.0 | 3.0 | 91.82 | 8.18 | 8.453 | 6.7 |
| MS-10 | M-2 | H-1 | 95.0 | 5.0 | 86.83 | 13.17 | 8.162 | 11.1 |
| * MS-11 | M-3 | H-1 | 99.5 | 0.5 | 98.57 | 1.43 | 8.847 | 0.8 |
| * MS-12 | M-3 | H-1 | 99.0 | 1.0 | 97.17 | 2.83 | 8.765 | 1.7 |
| * MS-13 | M-3 | H-1 | 98.0 | 2.0 | 94.45 | 5.55 | 8.606 | 3.3 |
| * MS-14 | M-3 | H-1 | 97.0 | 3.0 | 91.82 | 8.18 | 8.453 | 5.0 |
| MS-15 | M-3 | H-1 | 95.0 | 5.0 | 86.83 | 13.17 | 8.162 | 8.3 |
| * MS-16 | M-1 | H-2 | 95.0 | 5.0 | 87.19 | 12.81 | 8.196 | 8.3 |

In Table 3, the sample numbers of the samples outside the scope of the present invention are asterisked.

In Table 3, "Specific gravity" was measured by a gas phase substitution method. The "Semiconductor content" in the "Semiconductor content/SSA of metal powder" indicates the coating amount of the semiconductor powder fixed to the metal particle surfaces and was measured by an ICP-AES method (inductively coupled plasma atomic emission spectroscopy). The "SSA of metal powder" was measured by a BET method.

An organic vehicle was obtained by dissolving an ETHOCEL® (ethyl cellulose) resin having a weight-average molecular weight of $5 \times 10^4$ and an alkyd resin having a weight-average molecular weight of $8 \times 10^3$ in terpineol. In the organic vehicle, the ETHOCEL® (ethyl cellulose) resin content was 9.0% by weight, the alkyd resin content was 4.5% by weight, and the terpineol content was 86.5% by weight.

Next, a semiconductor powder indicated in Table 1 and a metal powder indicated in Table 2, or a semiconductor-metal complex powder indicated in Table 3 was mixed with the organic vehicle so that the volume percents shown in Table 4 were satisfied. Each resulting mixture was dispersed by using a three-roll mill. As a result, discharge supporting electrode pastes S-1 to S-26 were obtained.

TABLE 4

| Discharge supporting electrode paste No. | Semiconductor-metal complex powder | | | | | | | | | | |
|---|---|---|---|---|---|---|---|---|---|---|---|
| | MS-1 | MS-2 | MS-3 | MS-4 | MS-5 | MS-6 | MS-7 | MS-8 | MS-9 | MS-10 | MS-11 |
| * S-1 | 14.0 | — | — | — | — | — | — | — | — | — | — |
| * S-2 | — | 14.0 | — | — | — | — | — | — | — | — | — |
| S-3 | — | — | 14.0 | — | — | — | — | — | — | — | — |
| S-4 | — | — | — | 14.0 | — | — | — | — | — | — | — |
| S-5 | — | — | — | — | 14.0 | — | — | — | — | — | — |
| * S-6 | — | — | — | — | — | 14.0 | — | — | — | — | — |
| * S-7 | — | — | — | — | — | — | 14.0 | — | — | — | — |
| * S-8 | — | — | — | — | — | — | — | 14.0 | — | — | — |
| * S-9 | — | — | — | — | — | — | — | — | 14.0 | — | — |
| S-10 | — | — | — | — | — | — | — | — | — | 14.0 | — |
| * S-11 | — | — | — | — | — | — | — | — | — | — | 14.0 |
| * S-12 | — | — | — | — | — | — | — | — | — | — | — |
| * S-13 | — | — | — | — | — | — | — | — | — | — | — |
| * S-14 | — | — | — | — | — | — | — | — | — | — | — |
| S-15 | — | — | — | — | — | — | — | — | — | — | — |
| * S-16 | — | — | — | — | — | — | — | — | — | — | — |
| * S-17 | — | — | — | — | — | — | — | — | — | — | — |
| * S-18 | — | — | — | — | — | — | — | — | — | — | — |
| * S-19 | — | — | — | — | — | — | — | — | — | — | — |
| * S-20 | — | — | — | — | — | — | — | — | — | — | — |
| * S-21 | — | — | — | — | — | — | — | — | — | — | — |
| * S-22 | — | — | — | — | — | — | — | — | — | — | — |
| * S-23 | — | — | — | — | — | — | — | — | — | — | — |
| * S-24 | — | — | — | — | — | — | — | — | — | — | — |
| * S-25 | — | — | — | — | — | — | — | — | — | — | — |
| * S-26 | — | — | — | — | — | — | — | — | — | — | — |

| Discharge supporting electrode paste No. | Semiconductor-metal complex powder | | | | | Metal powder | Semiconductor powder | | Organic vehicle |
|---|---|---|---|---|---|---|---|---|---|
| | MS-12 | MS-13 | MS-14 | MS-15 | MS-16 | M-1 | H-1 | H-2 | |
| * S-1 | — | — | — | — | — | — | — | — | 86.0 |
| * S-2 | — | — | — | — | — | — | — | — | 86.0 |
| S-3 | — | — | — | — | — | — | — | — | 86.0 |
| S-4 | — | — | — | — | — | — | — | — | 86.0 |
| S-5 | — | — | — | — | — | — | — | — | 86.0 |
| * S-6 | — | — | — | — | — | — | — | — | 86.0 |
| * S-7 | — | — | — | — | — | — | — | — | 86.0 |
| * S-8 | — | — | — | — | — | — | — | — | 86.0 |
| * S-9 | — | — | — | — | — | — | — | — | 86.0 |
| S-10 | — | — | — | — | — | — | — | — | 86.0 |
| * S-11 | — | — | — | — | — | — | — | — | 86.0 |
| * S-12 | 14.0 | — | — | — | — | — | — | — | 86.0 |
| * S-13 | — | 14.0 | — | — | — | — | — | — | 86.0 |
| * S-14 | — | — | 14.0 | — | — | — | — | — | 86.0 |
| S-15 | — | — | — | 14.0 | — | — | — | — | 86.0 |
| * S-16 | — | — | — | — | 14.0 | — | — | — | 86.0 |
| * S-17 | — | — | — | — | — | 13.8 | 0.2 | — | 86.0 |
| * S-18 | — | — | — | — | — | 13.6 | 0.4 | — | 86.0 |
| * S-19 | — | — | — | — | — | 13.2 | 0.8 | — | 86.0 |
| * S-20 | — | — | — | — | — | 12.9 | 1.1 | — | 86.0 |
| * S-21 | — | — | — | — | — | 12.2 | 1.8 | — | 86.0 |
| * S-22 | — | — | — | — | — | 13.8 | — | 0.2 | 86.0 |
| * S-23 | — | — | — | — | — | 13.6 | — | 0.4 | 86.0 |
| * S-24 | — | — | — | — | — | 13.2 | — | 0.8 | 86.0 |
| * S-25 | — | — | — | — | — | 12.9 | — | 1.1 | 86.0 |
| * S-26 | — | — | — | — | — | 12.2 | — | 1.8 | 86.0 |

In Table 4, the sample numbers of the samples outside the scope of the present invention are asterisked.

(3) Preparation of Discharge Electrode Paste

Blended were 40% by weight of a Cu powder having an average particle diameter of 1 μm, 40% by weight of a Cu powder having an average particle diameter of 3 μm, and 20% by weight of an organic vehicle prepared by dissolving ethyl cellulose in terpineol. The resulting mixture was mixed by a three-roll mill to obtain a discharge electrode paste.

(4) Preparation of Combustibly Removable Layer Resin Bead Paste

A resin bead paste for forming a combustibly removable layer that is combustibly removed upon firing to form a cavity was prepared. Blended were 38% by weight of crosslinked acrylic resin beads having an average particle diameter of 1 μm and 62% by weight of an organic vehicle prepared by dissolving ethyl cellulose in dihydroterpinyl acetate, and the resulting mixture was mixed by a three-roll mill to obtain a combustibly removable layer resin bead paste.

(5) Preparation of Outer Terminal Electrode Paste

Blended were 80% by weight of a Cu powder having an average particle diameter of about 1 µm, 5% by weight of an alkali borosilicate glass frit having a transition point of 620° C., a softening point of 720° C., and an average particle diameter of about 1 µm, and 15% by weight of an organic vehicle obtained by dissolving ethyl cellulose in terpineol. The resulting mixture was mixed by a three-roll mill so as to prepare an outer terminal electrode paste.

(6) Printing of Pastes

Figure 4:
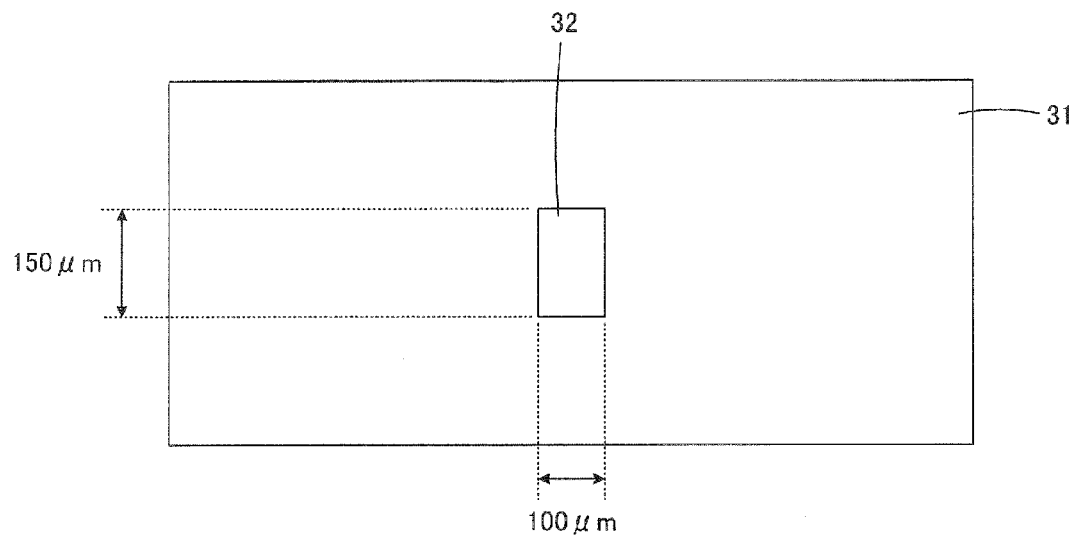
FIG. 4 is a plan view illustrating a step of producing an ESD protection device 42 prepared in Experimental Example, in which a green discharge supporting electrode 32 is formed on a ceramic green sheet 31.

First, as shown in FIG. 4, the discharge supporting electrode paste was applied on one main surface of the ceramic green sheet 31 so as to form a green discharge supporting electrode 32 of 150 µm×100 µm in size. One of the discharge supporting electrode pastes S-1 to S26 having various compositions shown in Table 4 was used as the discharge supporting electrode paste as shown in the "Discharge supporting electrode paste" column in Table 5.

Figure 5:
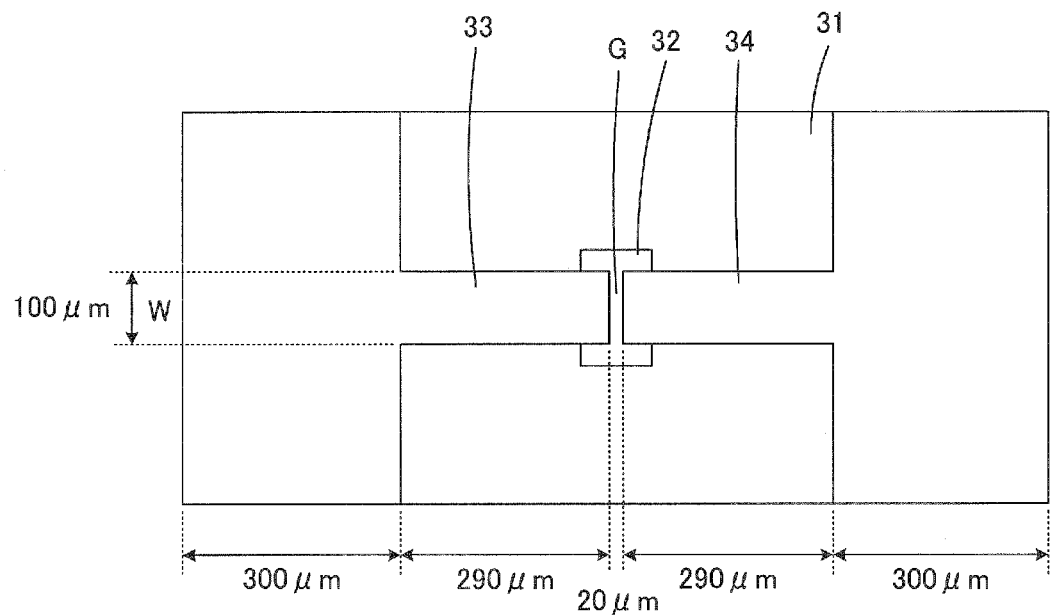
FIG. 5 is a plan view illustrating a step of producing the ESD protection device 42 prepared in Experimental Example, in which a first green discharge electrode 33 and a second green discharge electrode 34 are formed after the step illustrated in FIG. 4.

Next, the discharge electrode paste was applied to the main surface of the ceramic green sheet 31 so as to overlap a part of the green discharge supporting electrode 32. As a result, a first green discharge electrode 33 and a second green discharge electrode 34 were formed as shown in FIG. 5. The first green discharge electrode 33 and the second green discharge electrode 34 are opposed to each other with a gap G of 20 µm therebetween on the green discharge supporting electrode 32. The width W of the opposing portions was set to 100 µm. FIG. 5 illustrates measurements of other parts also.

Figure 6:
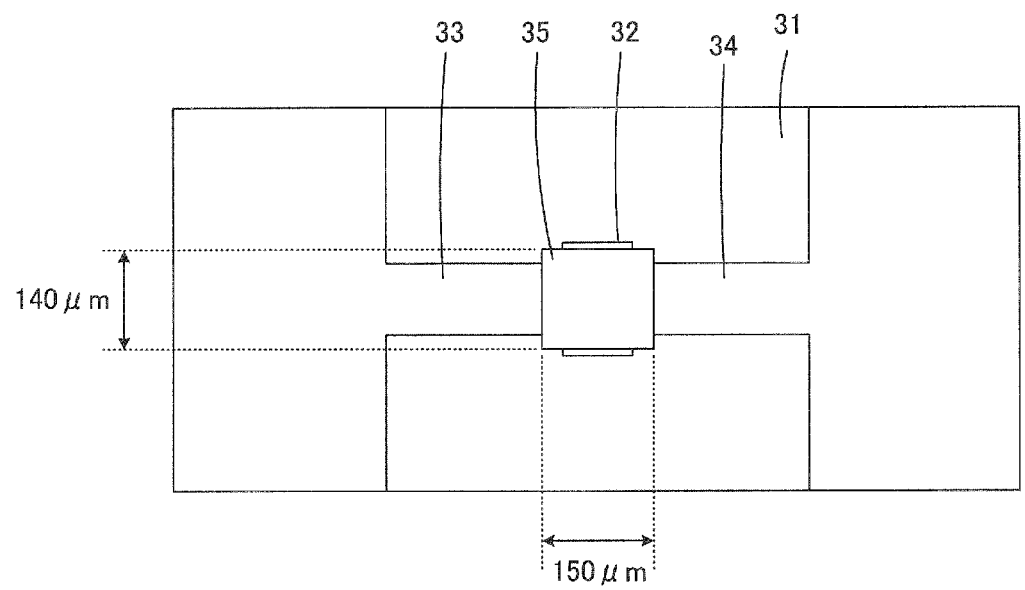
FIG. 6 is a plan view illustrating a step of producing the ESD protection device 42 prepared in Experimental Example, in which a green combustibly removable layer 35 is formed after the step illustrated in FIG. 5.

Next, as shown in FIG. 6, the combustibly removable layer resin bead paste was applied so as to cover the gap G between the first green discharge electrode 33 and the second green discharge electrode 34 and to form a green combustibly removable layer 35 140 µm×150 µm in size.

(7) Stacking and Press Bonding

Figure 7:
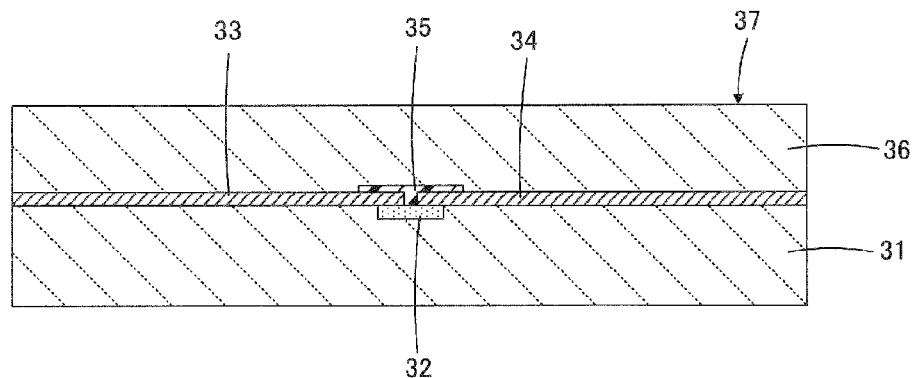
FIG. 7 is a cross-sectional view illustrating a step of producing the ESD protection device 42 prepared in Experimental Example, in which a second ceramic green sheet 36 is stacked after the step illustrated in FIG. 6.

Referring to FIG. 7, a plurality of ceramic green sheets 36 on which no paste was applied were stacked on and press-bonded with the main surface of the ceramic green sheet 31 on which the green discharge supporting electrode 32, the green discharge electrodes 33 and 34, and the green combustibly removable layer 35 were formed. As a result, a green insulator substrate 37 was obtained. The green insulator substrate 37 was adjusted so that the thickness thereof after firing was to be 0.3 mm.

(8) Cutting and Printing of Outer Terminal Electrode Paste

The insulator substrate 37 was cut with a micro-cutter so that the dimension in plan view after firing was to be 1.0 mm×0.5 mm. It should be understood that the measurements shown in FIG. 5 and the contours of the ceramic green sheet 31 and the like shown in FIGS. 4 to 7 are those at a stage after this cutting step.

Figure 8:
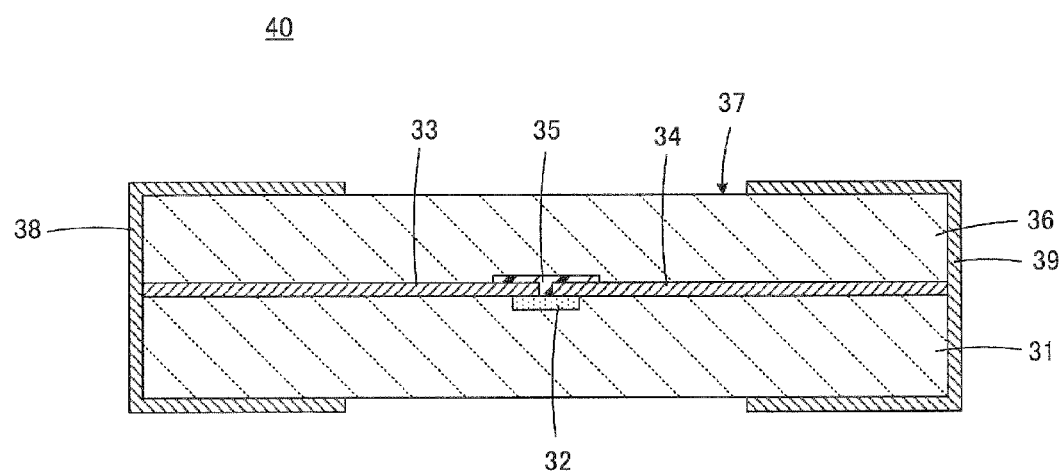
FIG. 8 is a cross-sectional view illustrating a step of producing the ESD protection device 42 prepared in Experimental Example, in which a first green outer terminal electrode 38 and a second green outer terminal electrode 39 are formed after the step illustrated in FIG. 7.

Next, as shown in FIG. 8, the outer terminal electrode paste was applied to outer surfaces of the insulator substrate 37 so as to form a first green outer terminal electrode 38 and a second green outer terminal electrode 39 respectively connected to the first green discharge electrode 33 and the second green discharge electrode 34. As a result, a green ESD protection device 40 was obtained.

(9) Firing

Figure 9:
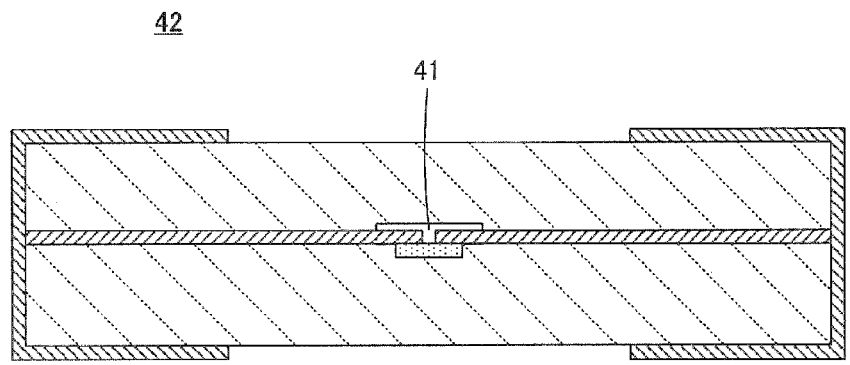
FIG. 9 is a cross-sectional view of the completed ESD protection device 42 obtained by performing a firing step after the step illustrated in FIG. 8.

The green ESD protection device 40 was fired in a firing furnace with an atmosphere controlled by using $N_2/H_2/H_2O$ at an appropriate maximum temperature in the range of 980° C. to 1000° C. As a result, an ESD protection device 42 having a cavity 41 as shown in FIG. 9 was obtained. The atmosphere of the firing furnace was adjusted at an oxygen concentration that did not cause oxidation of Cu from beginning to end.

<Evaluation of Properties>

ESD protection devices related to the samples prepared as described above were evaluated by the methods described below in terms of initial properties, namely, an initial shorting property and a peak voltage property, and reliability properties, namely, a repeated peak voltage property and a repeated shorting property.

(1) Initial Shorting Property

A direct voltage of 50 V was applied between the outer terminal electrodes of the ESD protection device of each sample so as to measure the insulation resistance. Those samples which exhibited an insulation resistance of $10^8 \Omega$ or higher were evaluated as having a good initial shorting property and are indicated by "A" in the "Initial shorting" column in Table 5. Those samples which exhibited an insulation resistance less than $10^8 \Omega$ were evaluated as having a poor initial shorting property and are indicated by "F" in the aforementioned column.

Note that ESD protection devices evaluated as having poor initial shorting properties were assumed to be unsuitable for practical application and further property evaluation (peak voltage property, repeated peak voltage property, and repeated shorting property) was not performed.

(2) Peak Voltage Property

Static electricity of 8 kV was applied to the ESD protection device of each sample by using an electrostatic test gun. The voltage detected with an oscilloscope during this process was defined to be the peak voltage and those samples which exhibited a peak voltage less than 500 V were evaluated as having a good peak voltage property and are indicated by "A" in the "Peak voltage" column in Table 5. Those samples which exhibited a peak voltage of 500 V or higher were evaluated as having a poor peak voltage property and are indicated by "F" in the aforementioned column.

(3) Repeated Peak Voltage Property

The same instrument used in evaluating the peak voltage property described above was used to apply static electricity of 8 kV 100 times to the ESD protection device of each sample. Upon completion of 100 times of application, static electricity of 8 kV was again applied to measure the peak voltage. Those samples which exhibited a peak voltage less than 500 V were evaluated as having a good repeated peak voltage property and are indicated by "A" in the "Repeated peak voltage" column in Table 5. Those samples which exhibited a peak voltage of 500 V or higher were evaluated as having a poor repeated peak voltage property and are indicated by "F" in the aforementioned column.

(4) Repeated Shorting Property

The same instrument used in evaluating the peak voltage property and the repeated peak voltage property described above was used to apply static electricity of 8 kV 100 times to the ESD protection device of each sample. The insulation resistance of each sample was measured every time the static electricity was applied, and those samples which never exhibited a resistance less than $10^6 \Omega$ were evaluated as having a good repeated shorting property and are indicated by "A" in the "Repeated shorting" column in Table 5. Those samples which exhibited a resistance less than $10^6 \Omega$ even once were assumed as having a poor repeated shorting property and are indicated by "F" in the aforementioned column.

(5) Comprehensive Evaluation

Those samples which exhibited a good initial shorting property, a good peak voltage property, a good repeated peak voltage property, and a good repeated shoring property were evaluated as suitable for practical application and are indicated by "A" in the "Comprehensive evaluation" column in Table 5. Those samples which performed poorly in at least one (initial shorting property in this experiment) of these properties were evaluated as unsuitable for practical application and are indicated by "F" in the "Comprehensive evaluation" column in Table 5.

TABLE 5

| Sample No. | Discharge supporting electrode paste | Initial properties | | Reliability properties | | Comprehensive evaluation |
|---|---|---|---|---|---|---|
| | | Initial shorting | Peak voltage | Repeated peak voltage | Repeated shorting | |
| *1 | S-1 | F | — | — | — | F |
| *2 | S-2 | F | — | — | — | F |
| 3 | S-3 | A | A | A | A | A |
| 4 | S-4 | A | A | A | A | A |
| 5 | S-5 | A | A | A | A | A |
| *6 | S-6 | F | — | — | — | F |
| *7 | S-7 | F | — | — | — | F |
| *8 | S-8 | F | — | — | — | F |
| *9 | S-9 | F | — | — | — | F |
| 10 | S-10 | A | A | A | A | A |
| *11 | S-11 | F | — | — | — | F |
| *12 | S-12 | F | — | — | — | F |
| *13 | S-13 | F | — | — | — | F |
| *14 | S-14 | F | — | — | — | F |
| 15 | S-15 | A | A | A | A | A |
| *16 | S-16 | F | — | — | — | F |
| *17 | S-17 | F | — | — | — | F |
| *18 | S-18 | F | — | — | — | F |
| *19 | S-19 | F | — | — | — | F |
| *20 | S-20 | F | — | — | — | F |
| *21 | S-21 | F | — | — | — | F |
| *22 | S-22 | F | — | — | — | F |
| *23 | S-23 | F | — | — | — | F |
| *24 | S-24 | F | — | — | — | F |
| *25 | S-25 | F | — | — | — | F |
| *26 | S-26 | F | — | — | — | F |

In Table 5, the sample numbers of the samples outside the scope of the present invention are asterisked.

The ESD protection devices of Samples 3 to 5, 10 and 15 within the scope of the present invention exhibited good initial properties (initial shorting property and peak voltage property) and good reliability properties (repeated peak voltage property and repeated shorting property). The discharge supporting electrode portions of these samples were observed with SEM. The observation found that Cu particles were bonded to each other with a thin glassy substance composed of $SiO_2$.

In contrast, the ESD protection devices of Samples 1, 2, 6 to 9, 11 to 14, and 16 outside the scope of the present invention exhibited poor initial shorting properties. The discharge supporting electrode portions of these samples were observed with SEM and the observation found that the Cu particles had underwent grain growth. The cause of the poor initial shorting property in Samples 1, 2, 6 to 9, and 11 to 14 is presumably that because the "Semiconductor content/SSA of metal powder" in Table 3 was less than 8, the amount of the silicon carbide powder coating the Cu powder per unit surface was small and the exposed surface of the Cu powder increased and became sintered to each other. For Sample 16, the cause is presumably that because a coarse semiconductor powder H-2 having an average particle diameter of 500 nm shown in Table 1 was used, the exposed surfaces of the Cu powder were increased and the exposed surfaces became sintered to each other.

The ESD protection devices of Samples 17 to 26 outside the scope of the present invention also exhibited poor initial shorting properties. The discharge supporting electrode portions of these samples were observed with SEM, and the observation found that there were portions where the Cu powder particles underwent grain growth and portions where the glassy substance was segregated. The cause of the poor initial shorting properties is probably that because a silicon carbide powder and a Cu powder not formed into a complex was used instead of a semiconductor-metal complex powder in which silicon carbide powder was fixed to surfaces of the Cu powder, the exposed surfaces of the Cu powder were increased and the exposed surfaces became sintered to each other.

Experimental Example above shows that an ESD protection device that has stable properties and undergoes less deterioration of properties even when static electricity is repeatedly applied can be provided by the present invention. Accordingly, the present invention is widely applicable to a field of ESD protection devices used to protect various devices and apparatuses including semiconductor devices.

11, 11a, 42 ESD protection device
12 insulator substrate
16, 17 discharge electrode
18 discharge supporting electrode
19, 41 cavity
20, 21 outer terminal electrode
23 semiconductor film
24 metal particle
31, 36 ceramic green sheet
32 green discharge supporting electrode
33, 34 green discharge electrode
35 green combustibly removable layer
37 green insulator substrate
38, 39 green outer terminal electrode
40 green ESD protection device
G gap

The invention claimed is:

1. An ESD protection device comprising:
a first discharge electrode and a second discharge electrode arranged to oppose each other;
a discharge supporting electrode formed so as to span between the first and second discharge electrodes; and
an insulator substrate that retains the first and second discharge electrodes and the discharge supporting electrode,
wherein the discharge supporting electrode is constituted by a group of a plurality of metal particles each coated with a semiconductor film containing silicon carbide,
wherein the semiconductor film containing silicon carbide is directly fixed to surfaces of metal particles.

2. The ESD protection device according to claim 1, wherein $SiO_2$ is present on a surface of the semiconductor film.

3. The ESD protection device according to claim 1 or 2, wherein the metal particles comprise copper or a copper alloy containing copper as a main component.

4. The ESD protection device according to any one of claims 1 to 3, wherein the first and second discharge electrodes and the discharge supporting electrode are positioned inside the insulator substrate, the insulator substrate has a cavity where a gap between the first and second discharge electrodes lies, and the ESD protection device further comprises a first outer terminal electrode and a second outer terminal electrode which are formed on surfaces of the insulator substrate and respectively electrically connected to the first and second discharge electrodes.

5. A method for producing an ESD protection device, the method comprising:
- a step of preparing a semiconductor-metal complex powder in which a semiconductor powder containing silicon carbide is fixed to surfaces of metal particles;
- a step of preparing an insulator substrate;
- a step of forming a green discharge supporting electrode on a surface of or inside the insulator substrate, the green discharge supporting electrode containing the semiconductor-metal complex powder;
- a step of forming a first discharge electrode and a second discharge electrode on a surface of or inside the insulator substrate so that the first and second discharge electrodes oppose each other on the discharge supporting electrode; and
- a step of firing the green discharge supporting electrode,
- wherein the relationship between a coating amount Q [wt %] of the semiconductor powder in the semiconductor-metal complex powder and a specific surface area S [$m^2/g$] of the metal particles satisfies $Q/S \geq 8$.

6. The method for producing an ESD protection device according to claim 5, wherein
the step of preparing an insulator substrate includes a step of preparing a plurality of ceramic green sheets including a first ceramic green sheet and a second ceramic green sheet,
the step of forming a green discharge supporting electrode and the step of forming a first discharge electrode and a second discharge electrode are performed on the first ceramic green sheet, the method further comprises:

a step of forming a combustibly removable layer so as to cover a gap between the first and second discharge electrodes;

a step of obtaining the insulator substrate in a green state by stacking the second ceramic green sheet on the first ceramic green sheet so as to cover the green discharge supporting electrode, the first and second discharge electrodes, and the combustibly removable layer; and a step of forming a first outer terminal electrode and a second outer terminal electrode, which are respectively electrically connected to the first and second discharge electrodes, on surfaces of the insulator substrate, and the firing step includes a step of obtaining the insulator substrate by sintering the ceramic green sheets and a step of combustibly removing the combustibly removable layer.

\* \* \* \* \*